(12) United States Patent
Lee et al.

(10) Patent No.: US 7,573,920 B2
(45) Date of Patent: Aug. 11, 2009

(54) VERTICAL EXTERNAL CAVITY SURFACE EMITTING LASER

(75) Inventors: Jun-ho Lee, Seongnam-si (KR); Sang-moon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 11/907,473

(22) Filed: Oct. 12, 2007

(65) Prior Publication Data
US 2008/0112443 A1    May 15, 2008

(30) Foreign Application Priority Data
Nov. 14, 2006   (KR) ...................... 10-2006-0112448

(51) Int. Cl.
*H01S 3/10* (2006.01)
(52) U.S. Cl. .............................. 372/21; 372/22; 372/27
(58) Field of Classification Search .................. 372/21, 372/22, 50.124, 27
See application file for complete search history.

(56) References Cited

U.S. PATENT DOCUMENTS 4,181,899 A * 1/1980 Liu .............................. 372/22
2006/0251140 A1 * 11/2006 Lee .............................. 372/70
2007/0133640 A1 * 6/2007 Kim ...................... 372/50.124
2008/0031289 A1 * 2/2008 Cho et al. ...................... 372/22

* cited by examiner

*Primary Examiner*—Armando Rodriguez
(74) *Attorney, Agent, or Firm*—Harness, Dickey & Pierce, P.L.C.

(57) ABSTRACT

Provided is a Vertical External Cavity Surface Emitting Laser (VECSEL). The VECSEL includes a semiconductor chip, a pump laser, a narrow bandwidth polarization filter, an external mirror, and a Second Harmonic Generation (SHG) element. The semiconductor chip includes an active layer generating light having a wavelength and a reflective layer reflecting the light generated in the active layer. The pump laser emits a pump beam for exciting the active layer. The narrow bandwidth polarization filter is formed on the semiconductor chip and polarizes the light. The external mirror faces the active layer, amplifies the light emitted from the active layer by repeatedly reflecting the light toward the reflective layer, and outputs the amplified light out of the VECSEL. The SHG element is disposed between the narrow bandwidth polarization filter and the external mirror and converts the wavelength of the light.

17 Claims, 6 Drawing Sheets

VERTICAL EXTERNAL CAVITY SURFACE EMITTING LASER

PRIORITY STATEMENT

This application claims the benefit of Korean Patent Application No. 10-2006-0112448, filed on Nov. 14, 2006, in the Korean Intellectual Property Office, the disclosure of which is incorporated herein in its entirety by reference.

BACKGROUND

1. Field

Example embodiments relate to a Vertical External Cavity Surface Emitting Laser (VECSEL), and more particularly, to a simple, compact VECSEL having low manufacturing costs.

2. Description of the Related Art

Generally, vertical cavity surface emitting lasers (VCSELs) emit a laser beam in a direction perpendicular to a substrate. A VCSEL has a high coupling efficiency because it can oscillate in a single longitudinal mode with a narrow spectrum bandwidth and emit a beam having a small angle of divergence. Furthermore, since a conventional VCSEL can be easily integrated into other devices due to its structure, the conventional VCSEL may be used as a pumping light source. However, it is more difficult for the VCSEL to oscillate at a single transverse mode than edge emitting lasers because the laser beam from the VCSEL has a multimode state due to thermal lens effect induced by increased output power. Furthermore, the conventional VCSEL generally requires a narrow oscillation region for single traverse mode operation, thereby resulting in a low output power.

A conventional vertical external cavity surface emitting laser (VECSEL) provides the above-described advantages of a VCSEL while also realizing high power output. A conventional VECSEL has a gain region that is increased by replacing an upper mirror of the structure formed on a corresponding substrate with an external mirror. The external mirror is a mirror which is formed to be separate from the structure, and thus can obtain a high output power.

FIG. 1 schematically illustrates the configuration of a conventional VECSEL 10 using front optical pumping. Referring to FIG. 1, the VECSEL 10 includes a semiconductor chip 13 having a Distributed Bragg Reflector (DBR) layer 11 and an active layer 12 sequentially stacked on a heat sink 14, a pump laser 15 disposed in front of the semiconductor chip 13 and providing a pump beam, an external mirror 20 separated by a distance from the laser chip 13 and facing the semiconductor chip 13, and a lens 16 disposed between the pump laser 15 and the semiconductor chip 13 and focusing the pump beam emitted by the pump laser 15.

The VECSEL 10 may further include a Second Harmonic Generation (SHG) crystal 18 and a birefringent filter 17 disposed between the active layer 12 and the external mirror 20. The SHG crystal 18 may induce forming of light having double the frequency of a primary light exited in the active layer 12 and the birefringent filter 17 may increase SHG efficiency. Linear polarization and narrow longitudinal mode line-width are generally required to increase light conversion efficiency. The birefringent filter 17 may induce a narrow line-width and aid wavelength selection to increase light conversion efficiency.

The active layer 12 may have a multi-quantum well structure with Resonant Periodic Gain (RPG) and may be excited by a pump beam to emit a laser beam having a wavelength $\lambda_2$. The pump laser 15 may irradiate a pump beam having a shorter wavelength $\lambda_1$ than the primary light emitted from the active layer 12 onto the active layer 12 in order to excite the active layer 12.

In the above-mentioned conventional structure, if a pump beam emitted from the pump laser 15 at the wavelength $\lambda_1$ is incident on the active layer 12, the active layer 12 may be excited to generate light having a specific wavelength $\lambda_2$. The beam generated by the active layer 12 may be repeatedly reflected between the DBR layer 11 and the external mirror 20 to repeatedly pass through the active layer 12. A portion of the beam amplified in the active layer 12 may be emitted out of the VECSEL 10 through the external mirror 20. The beam exiting the active layer 12 may be filtered by the birefringent filter 17 to realize a narrow line-width, single longitudinal mode beam. The filtered beam may be converted into a beam having a different wavelength by the SHG crystal 18. For example, the SHG crystal 18 may convert a laser beam having an infrared wavelength range into a laser beam having a visible wavelength range.

The birefringent filter 17 must be oriented at a desired angle, i.e., Brewster's angle to a main path of a beam in order to select the polarization state and wavelength of a resonating beam. Furthermore, the birefringent filter 17 may require a jig for alignment according to the polarization direction, and thus the VECSEL 10 may be bulky. Thus, the conventional VECSEL 10 may not be suitable for a compact laser source in blue-green light source applications, for example. Furthermore, the birefringent filter 17 requires a complicated manufacturing process, thus resulting in high manufacturing costs.

SUMMARY

The present invention provides a low-cost, compact Vertical External Cavity Surface Emitting Laser (VECSEL).

According to an aspect of the present invention, there is provided a VECSEL including: a semiconductor chip including an active layer generating light having a predetermined wavelength and a reflective layer reflecting off the light generated in the active layer; a pump laser emitting a pump beam for exciting the active layer; a narrow bandwidth polarization filter formed on the semiconductor chip and polarizing the light; an external mirror facing the active layer, amplifying the light emitted from the active layer by repeatedly reflecting the light toward the reflective layer, and outputting the amplified light out the VECSEL; and a Second Harmonic Generation (SHG) element disposed between the narrow bandwidth polarization filter and the external mirror and converting the wavelength of the light.

The pump laser may be disposed to the rear of the semiconductor chip.

The reflective layer may be a Distributed Bragg Reflector (DBR) layer having a multi-layer structure including a stack having two semiconductor layers with different refractive indices alternately stacked therein.

The narrow bandwidth polarization filter includes two multi-layer structures, each structure formed having two layers with different reflectivities alternately stacked therein, and a spacer layer deposited between the two multi-layer structures and having a structure that is formed at a predetermined angle to the two multi-layer structures.

The space layer may be formed of an anisotropic material. The two layers with different reflectivities may also be formed of anisotropic materials.

BRIEF DESCRIPTION OF THE DRAWINGS

The above and other features, aspects and advantages of example embodiments will become more apparent from a review of the detailed description, which refers to the attached drawings in which.

DETAILED DESCRIPTION OF EXAMPLE EMBODIMENTS

Figure 1:
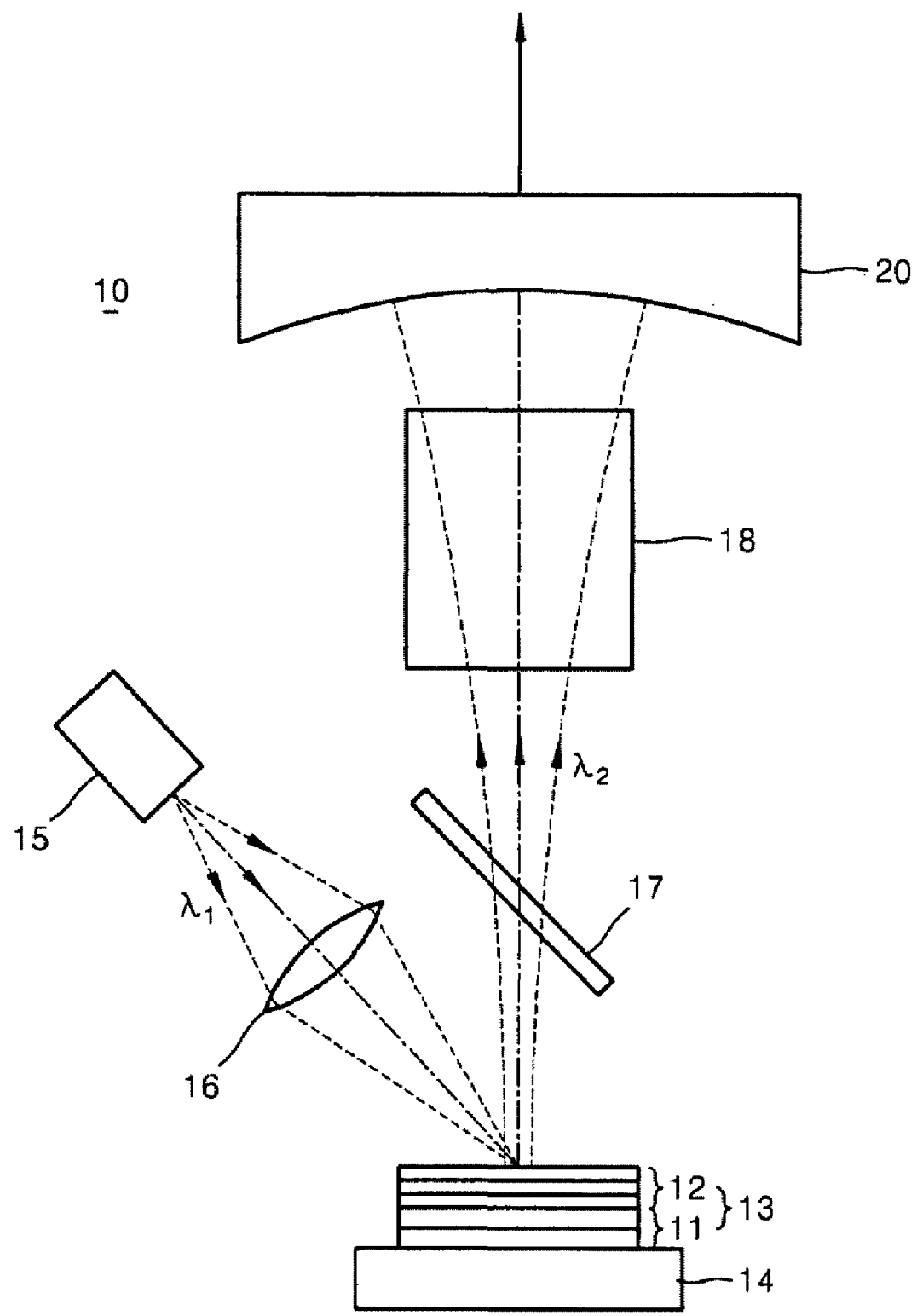
FIG. 1 schematically illustrates the configuration of a conventional Vertical External Cavity Surface Emitting Laser (VECSEL)

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

Figure 2:
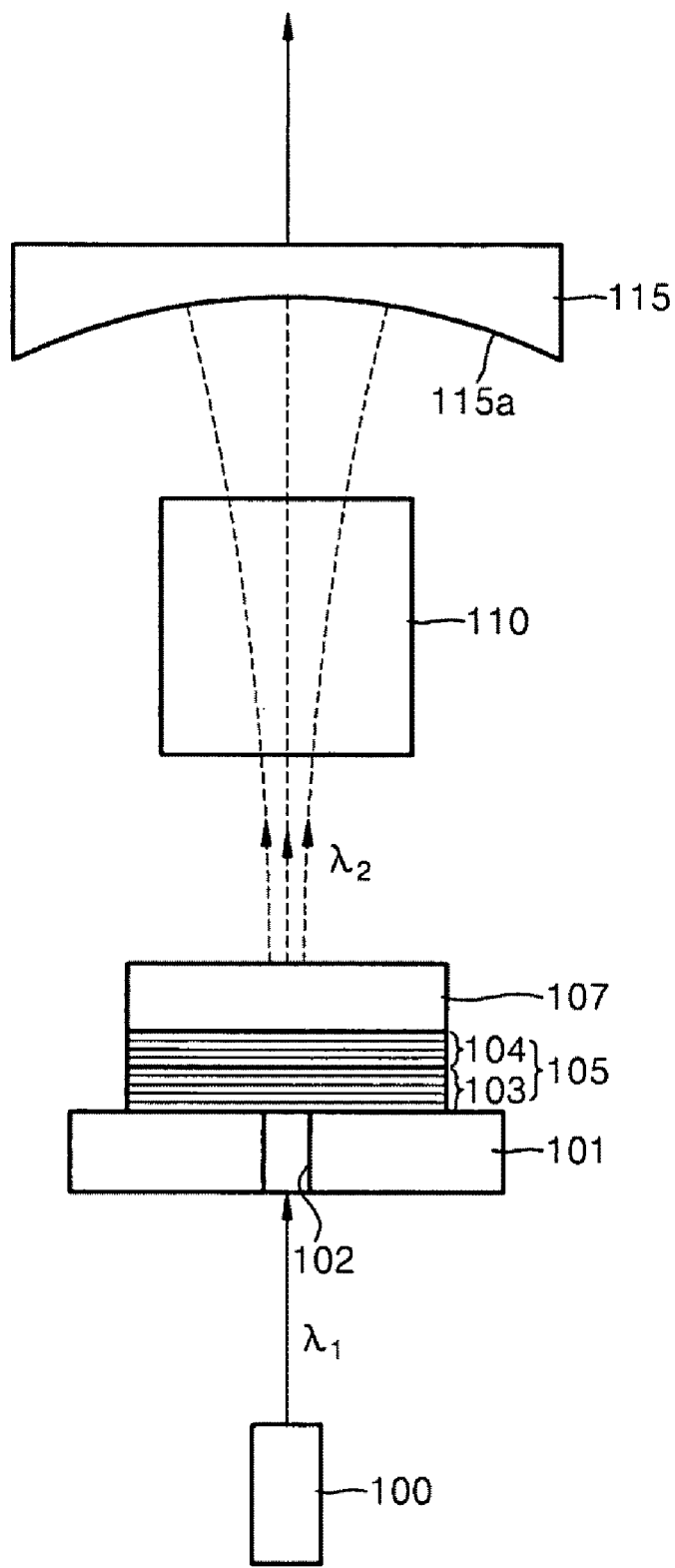
FIG. 2 schematically illustrates a VECSEL according to an example embodiment.

FIG. 2 schematically illustrates an example embodiment of a Vertical External Cavity Surface Emitting Laser (VECSEL). Referring to FIG. 2, a VECSEL according to an example embodiment may include a semiconductor chip 105, a narrow bandwidth polarization filter 107 disposed on the semiconductor chip 105, and an external mirror 115 spaced a distance from the semiconductor chip 105 and facing the semiconductor chip 105.

As shown in FIG. 2, the semiconductor chip 105 includes a reflective layer, e.g. a Distributed Bragg Reflector (DBR) layer 103 and an active layer 104 arranged on the DBR layer 103. The VECSEL may further include a heat sink 101 disposed on a bottom surface of the semiconductor chip 105. The heat sink 101 dissipates heat generated by the semiconductor chip 105.

Still referring to FIG. 2, a Second Harmonic Generation (SHG) element 110 is disposed between the narrow bandwidth polarization filter 107 and the external mirror 115 and converts the frequency of light output from the semiconductor chip 105. The SHG element 110 may be formed of non-linear crystal, for example.

In FIG. 2, a pump laser 110 is disposed to the rear of the semiconductor chip 105 and provides a pump beam. The "rear" refers to a direction opposite to the direction in which a beam is emitted from the semiconductor chip 105. The heat sink 101 may be formed of a material having suitable and/or excellent heat dissipation characteristics and optical transparency with respect to the pump beam, such as diamond, silicon carbide (SiC), sapphire, aluminum nitride (AlN), gallium nitride (GaN), or aluminum dioxide ($Al_2O_3$), for example, so that the pump beam emitted by the pump laser 110 can be transmitted through the heat sink 101. The heat sink 101 shown in FIG. 2 has an opening 102 formed along the propagation path of the pump beam.

The semiconductor chip 105 includes the active layer 104 generating a beam having a wavelength and the DBR layer 103 reflecting the beam generated in the active layer 104. As widely known in the art, the active layer 104 may include a quantum well layer. The quantum well layer may have a Resonant Periodic Gain (RPG) structure including a plurality of quantum wells and a plurality of barrier layers between the quantum wells. The active layer 104 is excited by absorbing a pump beam emitted by the pump laser 100 to emit light. To obtain gain, each quantum well is within the anti-node of a standing wave produced as light generated in the active layer 104 resonates between the external mirror 105 and the DBR layer 103. The light generated in the active layer 104 is amplified while it is repeatedly reflected between the external mirror 115 and the DBR layer 103.

The DBR layer 103 reflects light generated in the active layer 104 towards the external mirror 115 so that the light resonates between the external mirror 115 and the reflective layer 103. The DBR layer 103 may have a desired, optimum and/or maximum reflectivity at a wavelength $\lambda_2$ of primary light generated in the active layer 104. The DBR layer 103 may be formed from alternating stacking of two semiconductor layers having different refractive indices with each semiconductor layer thickness corresponding to approximately one quarter of the wavelength of primary light generated in the active layer 104, i.e., $\lambda_2/4$. For example, the DBR layer 103 that reflects the primary light generated in the active layer 104 and transmits a pump beam may be formed by alternating a plurality of layers of $Al_xGa_{(1-x)}$ and $Al_yGa_{(1-y)}$ As ($0 \leq x, y \leq 1, x \neq y$) with each layer thickness corresponding to about $\lambda_2/4$.

The DBR layer 103 may be designed to transmit the pump beam emitted from the pump laser 100 to the active layer 104. In the above-mentioned structure of an example embodiment, light generated in the active layer 104 is amplified as it is reflected between the DBR layer 103 and the external mirror 115 to repeatedly pass through the active layer 104. A portion of the amplified light may be output as a laser beam through the external mirror 115 while the remainder of the light is reflected again to the DBR layer 103. In this manner, the DBR layer 103 and the external mirror 115 act as a resonator.

The active layer 104 having the above-mentioned structure of an example embodiment may be excited by the pump beam having a shorter wavelength than light generated in the active layer 104. For example, if the active layer 104 emits light having an infrared wavelength of 920 or 1,060 nm, the pump beam may have a wavelength $\lambda_1$ of about 808 nm. If electrical pumping is used, it is difficult to inject carriers uniformly over a large area. Accordingly, optical pumping is used for obtaining a high output power.

An example embodiment of a VECSEL, as described above, may require less installation space than a conventional VECSEL because the pump laser 100 may be disposed behind the semiconductor chip 105. Furthermore, an example embodiment of a VECSEL, as described above, may be fabricated by a relatively a simple process, such as, by directly depositing the narrow bandwidth polarization filter 107 on the semiconductor chip 105, for example.

Figure 3A:
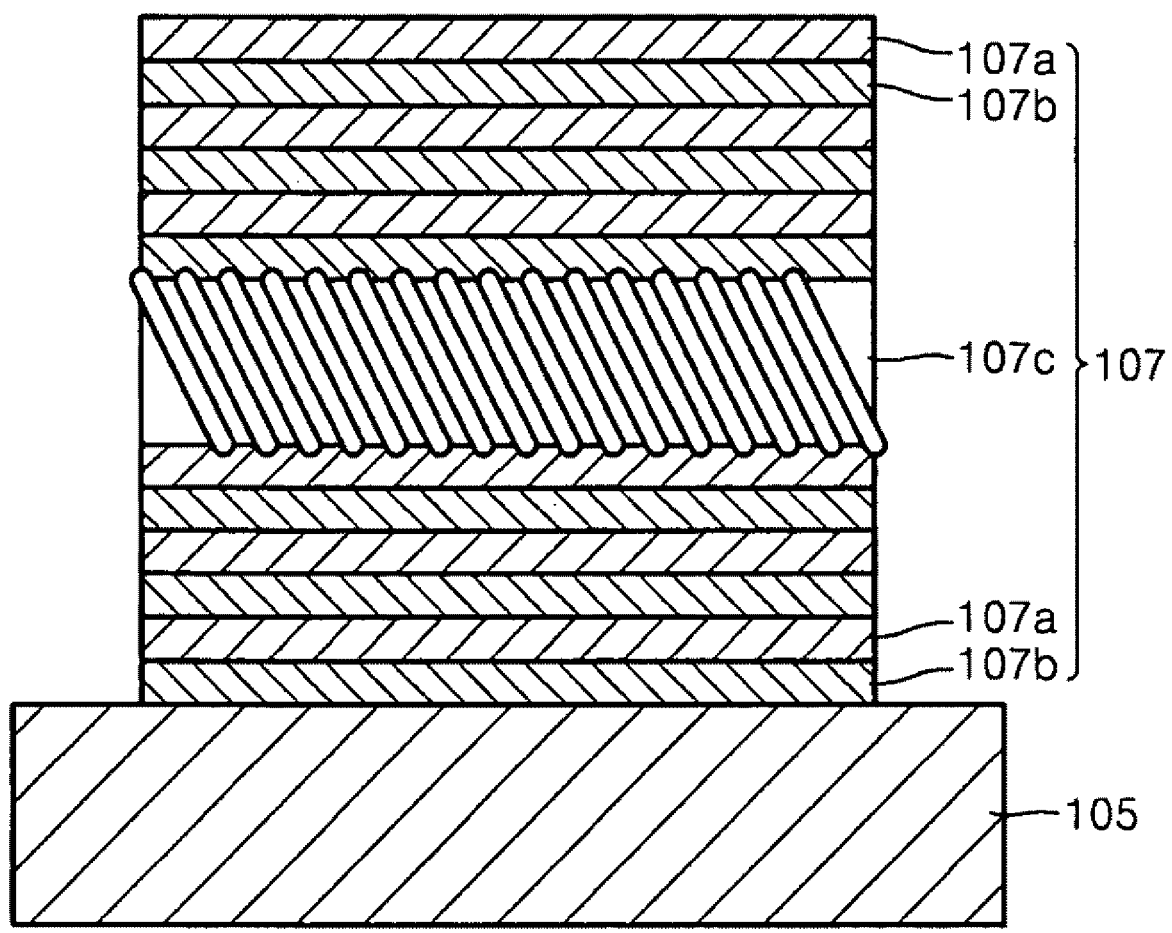
FIG. 3A illustrates an example layered structure of a narrow bandwidth polarization filter for an example embodiment of a VECSEL.
Figure 3B:
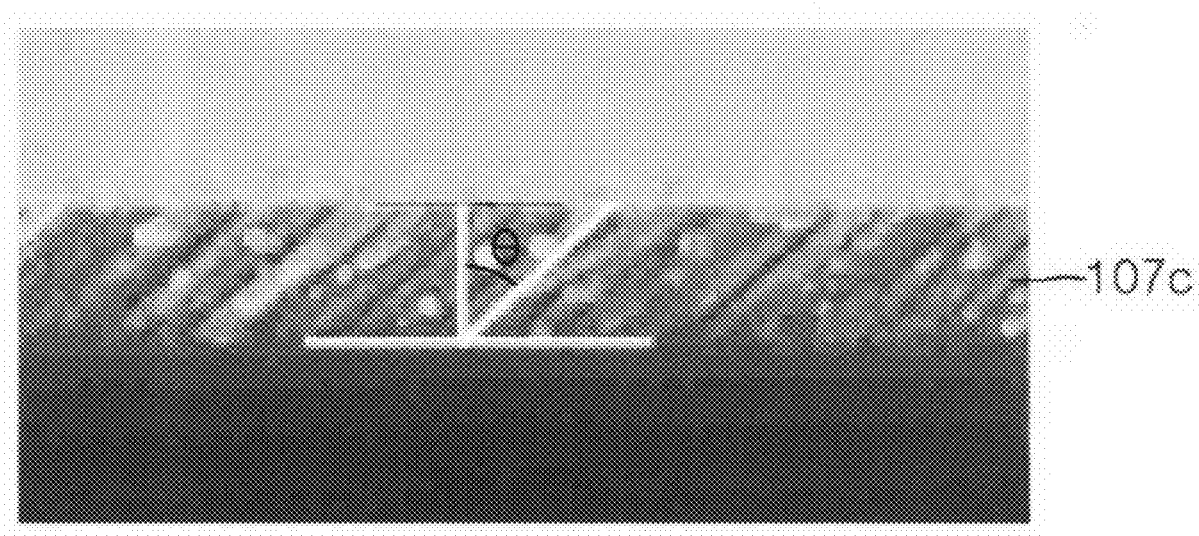
FIG. 3B illustrates a spacer layer in a narrow bandwidth polarization filter for an example embodiment of a VECSEL.

FIG. 3A illustrates an example embodiment of a layered structure of a narrow bandwidth polarization filter for a VECSEL. Referring to FIG. 3A, the narrow bandwidth polarization filter 107 includes two multi-layer structures, each structure having two layers 107a and 107b with different reflectances alternately stacked therein, and a spacer layer 107c interposed between the two multi-layer structures. That is, the narrow bandwidth polarization filter 107 includes a first stack having high and low reflectance layers 107a and 107b alternately stacked and a second stack having high and low reflectance layers 107a and 107b alternately stacked, and the spacer layer 107c formed between the first stack and the second stack. The spacer layer 107c may be formed using angular deposition, e.g., by depositing an anisotropic material obliquely at a desired angle. FIG. 3B is a photograph showing a state in which the spacer layer 107c has been deposited between the first stack and the second stack, each of the first and second stack having alternately stacked high and low reflectance layers 107a and 107b.

The high and low reflectance layers 107a and 107b may have a large reflectance difference according to an example embodiment. The high and low reflectance layers 107a and 107b may be formed of anisotropic materials with different reflectances. For example, the high and low reflectance layers 107a and 107b may be formed of $TiO_2$ and $SiO_2$, respectively. The spacer layer 107c may be formed by depositing $TiO_2$ at a desired angle θ, as illustrated in FIG. 3B. For example, the desired angle θ may be at and/or about 56.5°.

According to an example embodiment, the narrow bandwidth filter 107 may be deposited directly on the semiconductor chip 105 to reduce cost and complexity of fabrication. Further, the narrow bandwidth filter 107 may be integrated with the semiconductor chip 105 to reduce and/or eliminate the need for separate components for optical alignment.

Referring again to FIG. 2, the external mirror 115 faces the active layer 104 that is spaced a distance from the external mirror 115. The external mirror 115 may reflect a majority and/or most of light emitted from the active layer 104 back toward the active layer 104 for resonance and may transmit another portion of the light amplified by the resonance out of the VECSEL. In FIG. 2, the external mirror 115 has a concave reflecting surface 115a that can converge the reflected light onto the active layer 104.

Figure 4A:
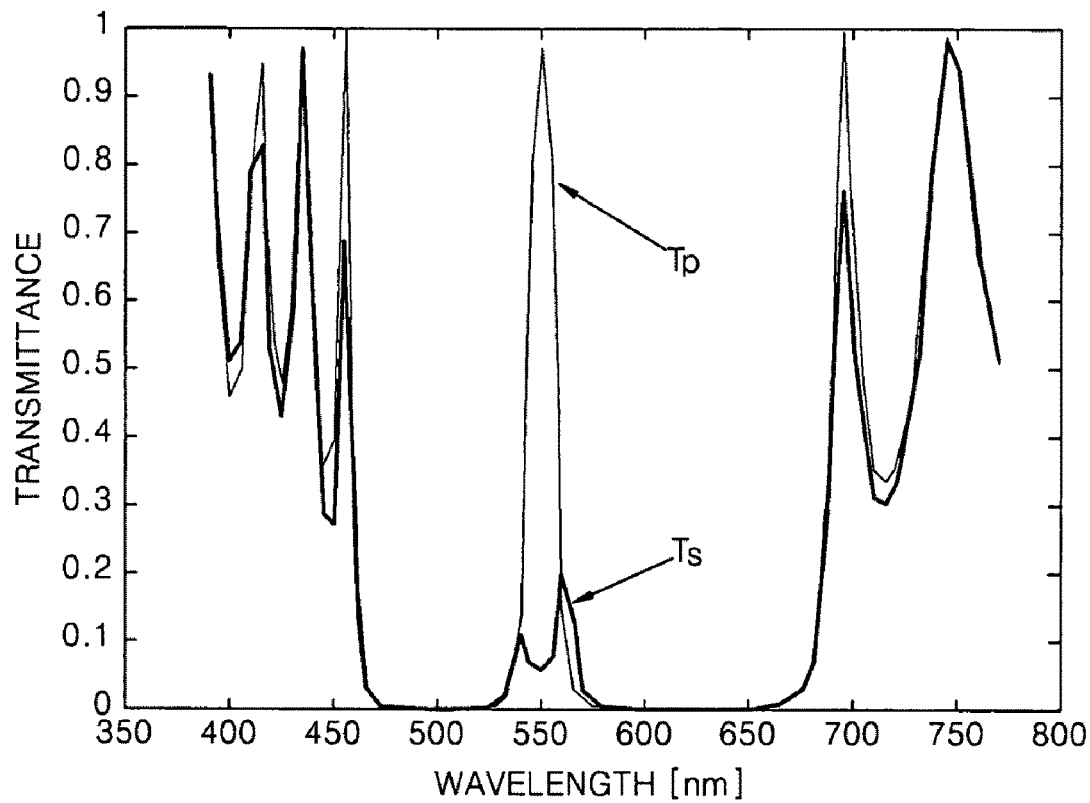
FIG. 4A is an example graph of transmittance versus wavelength of a beam passing through a narrow bandwidth polarization filter for an example embodiment of a VECSEL.
Figure 4B:
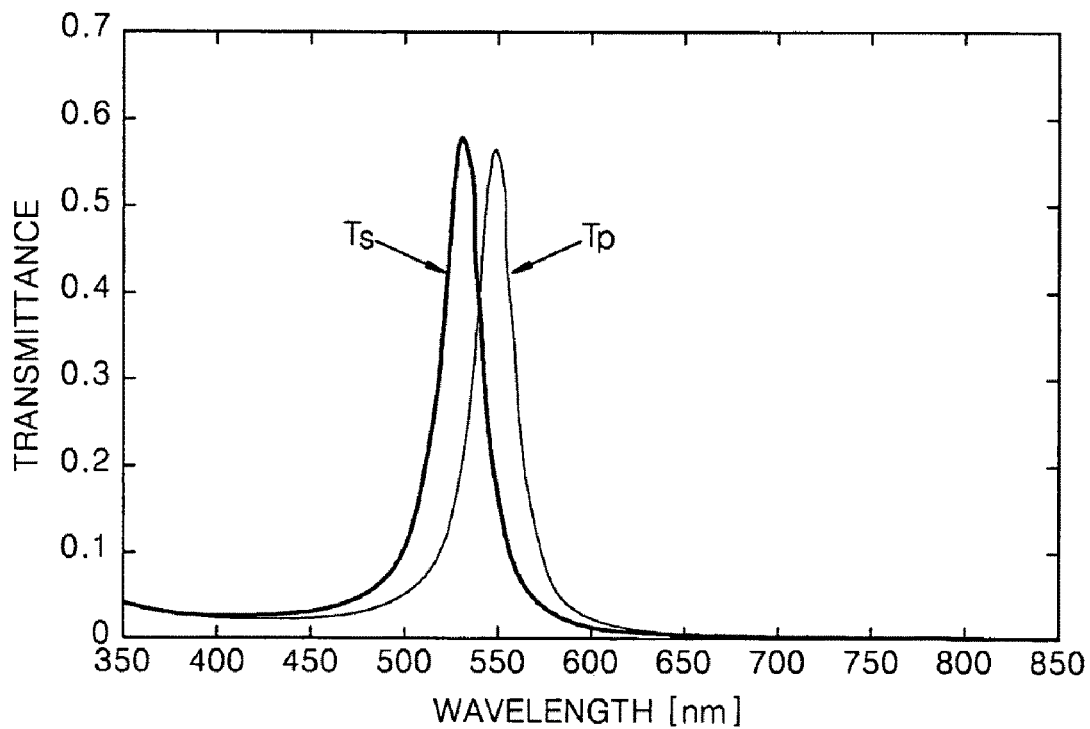
FIG. 4B is an example graph of transmittance versus peak wavelengths for longitudinal- and transverse-mode polarizations obtained by a narrow bandwidth polarization filter in an example embodiment of a VECSEL.

The operation of an example embodiment, such as the VECSEL of FIG. 2 will now be described in detail. A beam emitted by the pump laser 100 passes through the heat sink 101 and is incident on the semiconductor chip 105. The active layer 104 is excited by the incident beam to emit primary light. The primary light is polarized into longitudinal-mode polarization with a narrow line-width as it passes through the narrow bandwidth polarization filter 107. FIG. 4A is an example graph of transmittance versus wavelength of a beam passing through the narrow bandwidth polarization filter 107. Referring to FIG. 4A, longitudinal-mode polarization exhibits a very large transmittance Tp but transverse-mode polarization exhibits a very small transmittance Ts. FIG. 4B is a graph of transmittance versus peak wavelengths for longitudinal Tp and transverse Ts mode polarizations obtained by the narrow bandwidth polarization filter 107. As illustrated in FIG. 4B, a longitudinal-mode polarization having a narrow line-width can be obtained through the narrow bandwidth polarization filter 107. The light is converted into light having a different wavelength as it passes through the SHG element 110. For example, the converted light may have half the wavelength and double the frequency of the primary light generated by the active layer 104. The light is amplified while it is reflected between the external mirror 115 and the DBR layer 103 and is transmitted by the external mirror 115 out of the VECSEL.

Figure 5:
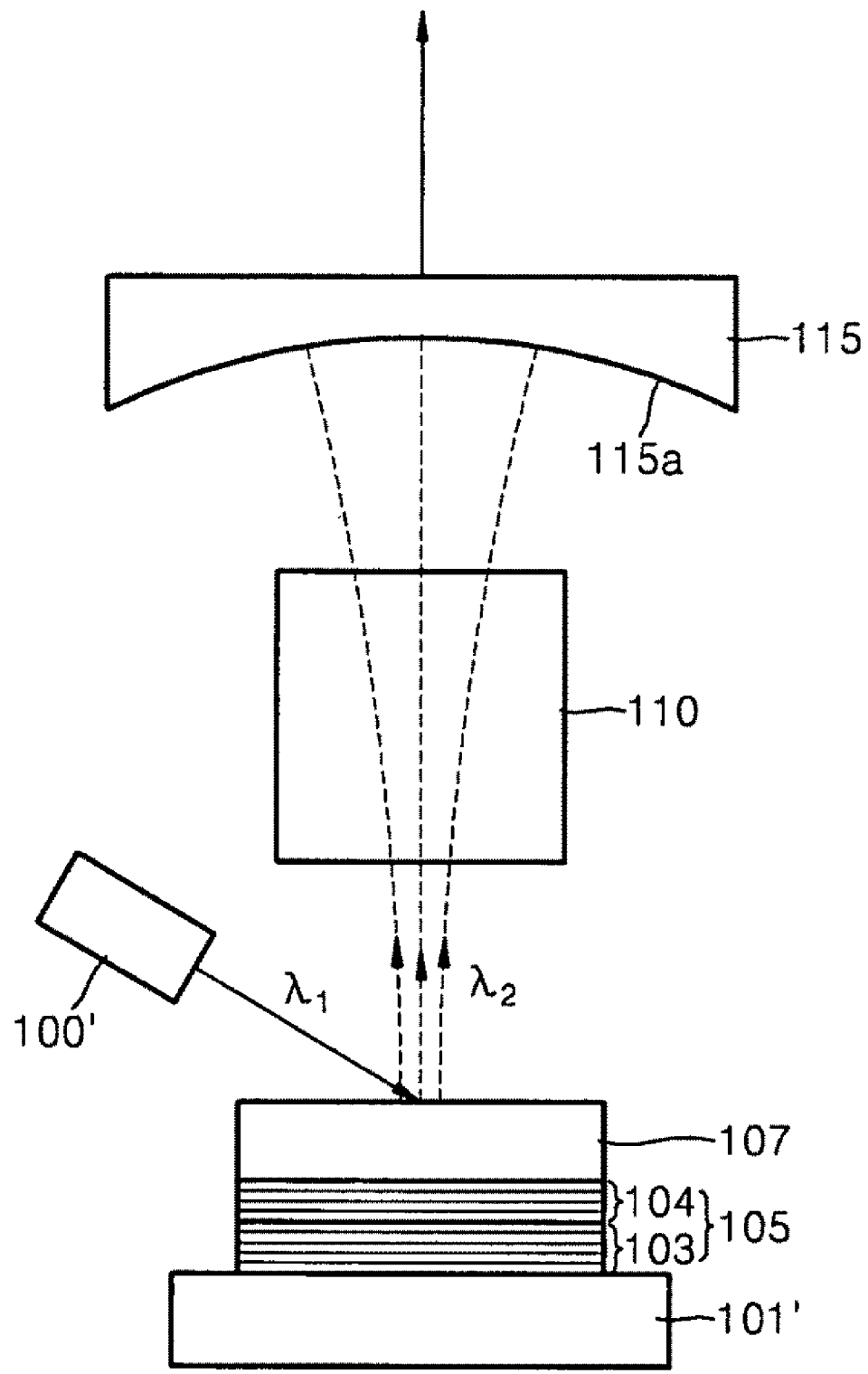
FIG. 5 schematically illustrates a VECSEL according to another example embodiment.

If the narrow bandwidth filter 107 is stacked directly on the semiconductor chip 105 according to an example embodiment, the pump laser 100 may be disposed to the rear of the semiconductor chip 105. However, referring to FIG. 5, according to another example embodiment, a pump laser 100' may be located to a side of the front of the active layer 104 of the semiconductor chip 105. In this case, a pump beam emitted from the pump laser 100' passes through the narrow bandwidth polarization filter 107 and is incident on the semiconductor chip 105. The active layer 104 of the semiconductor chip 105 may be excited by the pump beam to emit light. The light may be amplified in the same way as described with reference to FIG. 2. If the pump laser 100' is disposed in front of the semiconductor chip 105 as shown in FIG. 5, a hole may not be provided in the heat sink 101' for transmitting a beam.

A VECSEL according to an example embodiment may have a narrow bandwidth polarization filter formed on a semiconductor chip using a semiconductor process, which may significantly reduce the manufacturing costs and the overall size of the VECSEL. Thus, a compact VECSEL module may be provided and applied usefully to provide compact products.

An example embodiment may also allow integration of the narrow bandwidth filter with the semiconductor chip, thus reducing and/or eliminating the need for separate components for optical alignment. Furthermore, an example embodiment may allow an efficient creation of narrow linewidth polarization, which may increase wavelength conversion efficiency through a SHG element.

While example embodiments have been particularly shown in the drawings and described above, it will be understood by those of ordinary skill in the art that various changes in form and details may be made therein without departing from the spirit and scope of this disclosure.

What is claimed is:

1. A Vertical External Cavity Surface Emitting Laser (VECSEL) comprising:
    a semiconductor chip including an active layer generating light having a wavelength and a reflective layer reflecting the light generated in the active layer;
    a pump laser emitting a pump beam for exciting the active layer;
    a narrow bandwidth polarization filter formed on the semiconductor chip and polarizing the light;
    an external mirror facing the active layer, amplifying the light emitted from the active layer by repeatedly reflecting the light toward the reflective layer, and outputting the amplified light out of the VECSEL; and
    a Second Harmonic Generation (SHG) element disposed between the narrow bandwidth polarization filter and the external mirror, and converting the wavelength of the light.

2. The VECSEL of claim 1, wherein the pump laser is disposed to the rear of the semiconductor chip.

3. The VECSEL of claim 1, wherein the reflective layer is a Distributed Bragg Reflector (DBR) layer having a multi-layer structure including a stack having two semiconductor layers with different refractive indices alternately stacked therein.

4. The VECSEL of claim 3, wherein a thickness of each semiconductor layer is one quarter of the wavelength of the light.

5. The VECSEL of claim 1, wherein the narrow bandwidth polarization filter includes two multi-layer structures, each multi-layer structure having two layers with different reflectivities alternately stacked therein, and a spacer layer interposed between the two multi-layer structures and having a structure formed at an angle to the two multi-layer structures.

6. The VECSEL of claim 5, wherein the spacer layer includes an anisotropic material.

7. The VECSEL of claim 6, wherein the spacer layer includes $SiO_2$.

8. The VECSEL of claim 5, wherein the two layers with different reflectivities include anisotropic materials.

9. The VECSEL of claim 8, wherein the two layers include a first layer of $TiO_2$ and a second layer of $SiO_2$.

10. The VECSEL of claim 1, further comprising: a heat sink disposed on a bottom surface of the semiconductor chip and dissipating heat generated by the semiconductor chip.

11. The VECSEL of claim 10, wherein the heat sink has a hole formed therein.

12. The VECSEL of claim 5, wherein the angle is 56.5°.

13. The VECSEL of claim 10, wherein the heat sink is optical transparency with respect to the pump beam.

14. The VECSEL of claim 13, wherein the heat sink includes at least one of diamond, silicon carbide (SiC), sapphire, aluminum nitride (AlN), gallium nitride (GaN), an aluminum dioxide ($Al_2O_3$).

15. The VECSEL of claim 1, wherein the SHG element includes non-linear crystal.

16. The VECSEL of claim 1, wherein the pump laser is arranged in front of the semiconductor chip.

17. The VECSEL of claim 1, wherein the pump laser irradiates a pump beam having a shorter wavelength than the light emitted from the active layer.

* * * * *